(12) United States Patent
Van Der Cammen

(10) Patent No.: US 9,300,497 B2
(45) Date of Patent: Mar. 29, 2016

(54) PHASE DETECTOR

(71) Applicant: QUALCOMM Technologies, Inc., San Diego, CA (US)

(72) Inventor: Peter Van Der Cammen, Berkel en Rodenrijs (NL)

(73) Assignee: Qualcomm Technologies, Inc., San Diego, CA (US)

( * ) Notice: Subject to any disclaimer, the term of this patent is extended or adjusted under 35 U.S.C. 154(b) by 0 days.

(21) Appl. No.: 14/758,853

(22) PCT Filed: Jan. 9, 2013

(86) PCT No.: PCT/EP2013/050294
§ 371 (c)(1),
(2) Date: Jul. 1, 2015

(87) PCT Pub. No.: WO2014/108181
PCT Pub. Date: Jul. 17, 2014

(65) Prior Publication Data
US 2015/0349982 A1    Dec. 3, 2015

(51) Int. Cl.
*H04L 25/06* (2006.01)
*H04L 25/02* (2006.01)

(52) U.S. Cl.
CPC .................. *H04L 25/0278* (2013.01)

(58) Field of Classification Search
CPC ............................ H04L 25/061; H04L 25/063
USPC ......................................................... 375/317
See application file for complete search history.

(56) References Cited

U.S. PATENT DOCUMENTS

| | | |
|---|---|---|
| 6,822,433 B1 | 11/2004 | Gilbert |
| 2007/0035356 A1 | 2/2007 | Ranta |
| 2010/0123482 A1* | 5/2010 | Marton ................. H03L 7/0891 327/7 |
| 2010/0289711 A1 | 11/2010 | Boyle |
| 2013/0093483 A1* | 4/2013 | Lamanna ................. H03L 7/087 327/157 |
| 2015/0219701 A1* | 8/2015 | Solomko ................. G01R 25/00 327/12 |

OTHER PUBLICATIONS

International Search Report and Written Opinion—PCT/EP2013/050294—ISA/EPO—Oct. 7, 2013.
Yang Y. et al., "Design and preliminary evaluation of a portable device for the measurement of bioimpedance spectroscopy; Design and preliminary evaluation of a portable device", Physiological Measurement, Institute of Physics Publishing, Bristol, GB, vol. 27, No. 12, Dec. 1, 2006, pp. 1293-1310, XP020105705, ISSN: 0967-3334.

* cited by examiner

*Primary Examiner* — Khai Tran
(74) *Attorney, Agent, or Firm* — Smith Risley Tempel Santos LLC

(57) ABSTRACT

An alternative phase detector without the need for direct phase measurement is provided. The phase detector comprises three signal inputs ($S_1$, $S_2$, $S_3$), a ratio determination circuit (RDC) for determining at least two ratios of the respective input signals, and a calculation circuit (CC) to derive a measure of a phase difference between at least two input signals.

21 Claims, 4 Drawing Sheets

PD

PHASE DETECTOR

The present invention relates to phase detectors that may be used in impedance measurement systems, e.g. for determining the impedance of a signal path in a wireless communication device.

Impedance information provided by such an impedance measurement system could be used to match the impedance of the signal path.

TECHNICAL BACKGROUND

Impedance measurement systems can be used to determine the actual impedance of a signal path when the signal path has an impedance that depends on external conditions. In other words: when the signal path has a variable load impedance. In the case of mobile communication devices, the variable load impedance can be an antenna in a changing environment.

The transmission coefficient for transferred power can be optimized by tuning the signal line's impedance based on impedance information provided by an impedance measurement system.

Convention impedance measurement systems, e.g. known from U.S. Pat. No. 6,822,433, use two RSSI-chains to measure the levels of two signals. An additional conventional phase detector is needed to measure the phase between the two signals.

It is an object of the present invention to provide a phase detector that allows improved impedance measurement systems.

On that account, a phase detector according to independent claim 1 is provided. Dependent claims provide preferred embodiments of the invention.

SUMMARY OF THE INVENTION

A phase detector comprises a first signal input determined to receive a first signal $S_1$, a second signal input determined to receive a second signal $S_2$ having a phase difference $\alpha$ relative to the first signal $S_1$ and a third signal input determined to receive a third signal $S_3$. The phase detector further comprises a ratio determination circuit for determining at least two magnitude ratios selected from: $|S_1|/|S_2|$, $|S_2|/|S_3|$, $|S_3|/|S_1|$ or the respective inverse ratios. Further, the phase detector comprises a calculation circuit determined to derive a measure of the phase difference $\alpha$ by evaluating the two ratios obtained from the ratio determining circuit. To provide the measure of the phase difference $\alpha$, the phase detector comprises a signal output.

The present invention is mainly based on ideas to provide a phase detector for determining phase information of a signal propagating in a signal path as shown in FIG. 2.

Especially, the invention is based on the fact that the inventors have found a geometric correlation between signal levels and phase information on one hand and electric circuitry that allows to make use of this correlation on the other hand.

Such a detector circuit may be used in an impedance measurement system for a signal path shown in FIG. 2. The signal path SP may be connected to an antenna having a variable load impedance. Such an antenna and its load impedance is represented by an impedance $Z_x$. Further, the signal path SP comprises a sensing impedance $Z_{sense}$ which may be an inductive element IE. $V_{20}$ denotes the voltage drop across the load impedance $Z_x$. $V_{12}$ denotes the voltage drop across the impedance $Z_{sense}$. $V_{10}$ is the sum of the voltages $V_{20}$ and $V_{12}$: $V_{10}=V_{20}+V_{12}$. Thus, the impedance of the signal path SP equals the load impedance $Z_x$ plus the sensing impedance $Z_{sense}$ which may be a known impedance. From FIG. 2, it is clear that $Z=Z_{sens} V_{10}/V_{12}$ where $V_{10}$ and $V_{12}$ are voltages representable as complex numbers.

In one embodiment, the first signal $S_1$, the second signal $S_2$, and the third signal $S_3$ are voltage or current signals. However, other signals are possible, too.

The total impedance $Z$ of the signal path SP is the sum of $Z_{sense}$ and $Z_x$. Calculation results in $Z=Z_{sense} V_{10}/V_{12}$.

$V_{10}$ can be regarded as a complex voltage: $V_{10}=|V_{10}| \exp(j\omega t)$. Then, $V_{12}=|V_{12}| \exp(j(\omega t+\phi))$. Accordingly, $V_{10}/V_{12}=|V_{10}|/|V_{12}| \exp(j\phi)$ where $\phi$ is the phase difference between $V_{12}$ and $V_{10}$. The quantities $V_{12}$, $V_{10}$, and $V_{20}$ are shown in a complex plane view in FIG. 8. Depending on which phase difference (selected from $\alpha$, $\beta$, $\gamma$) between input signals is assigned with phase differences $\psi$, $\phi$ $\chi$ between the voltages $V_{10}$, $V_{20}$, and $V_{12}$, it is possible that $\alpha$ corresponds to $\psi$, $\beta$ corresponds to $\phi$ and $\gamma$ corresponds to $\chi$. It is possible that $\gamma=180°-\beta-\alpha$. In particular, it is possible that $S_1=S_2+S_3$.

As $Z$ is the unknown impedance of the signal path and $Z_{sense}$ is known, the problem of obtaining the actual value for $Z$ is reduced to the problem of obtaining the ratio $V_{10}/V_{12}$. This ratio is known by measuring the ratio of two signal amplitudes $|V_{10}|/|V_{12}|$ and the phase difference $\phi$. In contrast to the phase detector contained in the circuits of U.S. Pat. No. 6,822,433, the phase detector of the present invention is based on the idea that each set of two ratios of the above cited ratios intrinsically contains information about the phase difference $\phi$. Thus, after the ratio determination circuit determined at least two of these ratios, a calculation circuit can evaluate the two ratios and determine a measure of the phase difference $\phi$.

The complexity of the implementation of the phase detector is reduced when the signals $S_1$, $S_2$, and $S_3$ are voltage or current signals. Thus, in one embodiment, the first signal $S_1$, the second signal $S_2$, and the third signal $S_3$ are voltage or current signals.

In one embodiment, one of the signals $S_1$, $S_2$, and $S_3$ is the sum of the respective other two signals. It is, for example, possible that $S_1=S_2+S_3$.

In one embodiment, thus, the first signal $S_1$ is a voltage $V_{10}$ measured across the serial connection of the sensing impedance $Z_{sense}$ and the further impedance $Z_x$. The second signal $S_2$ is a voltage $V_{20}$ measured across the sensing impedance $Z_{sense}$. The third signal $S_3$ is a voltage $V_{12}$ measured across the further impedance $Z_x$.

This embodiment corresponds to the equivalent circuit diagram of FIG. 2.

In one embodiment, the cosine of $\alpha$ is the measure for the phase $\alpha$. Thus, the calculation circuit determines cosine $\alpha$ by evaluating the two ratios obtained from the ratio determining circuit.

In one embodiment, the ratio determination circuit works in the analog domain. However, it is possible that the ratio determination circuit works in the digital domain and the phase detector comprises an analog/digital converter.

It is possible that the calculation circuit works in the analog domain and it is possible that the calculation circuit works in the digital domain. When the calculation circuit works in the digital domain, it is preferred that the phase detector comprises an analog/digital converter. Then, the analog/digital converter can provide the calculation circuit working in the digital domain with the respective digital input signals.

In one embodiment, the ratio determination circuit comprises one, two, or three RSSI-chains (RSSI=Received Signal Strength Indicator) determined to provide a signal that is proportional to a logarithm of a signal selected from: the first signal $S_1$, the second signal $S_2$, and the third signal $S_3$.

Such an RSSI-chain can comprise a chain of amplifiers, e.g. limiter amplifiers, where a signal level indicator signal is derived from that is proportional to the logarithm of its input signal. A ratio, e.g. of voltages, can easily be obtained by subtracting an RSSI-chain output of the denominator from an RSSI-chain output of the numerator as a consequence of the addition theorem of the exponential function. If each output of the RSSI-chain has the same offset, the respective offset is eliminated by the subtraction.

Further, the cosine rule allows to obtain the cosine of phase difference φ by addition and subtraction of the above-mentioned ratios. As a result:

$$2 \cos \alpha = |S_1|/|S_2| + |S_2|/|S_1| - (|S_3|/|S_1| \cdot |S_3|/|S_2|).  \quad \text{(eqn. 1)}$$

Thus, the phase detector can easily provide information about the phase difference α without the need of directly measuring the phase difference α. Only one RSSI-chain is needed to determine a logarithm of an input signal and an adding or subtracting circuit is needed to determine the cosine of α by evaluating the logarithms of the input values provided by the RSSI-chain.

Thus, in one embodiment, the ratio determination circuit comprises one or two or three subtraction circuits.

In one embodiment, the ratio determination circuit provides a signal that is proportional to a logarithm of a ratio selected from: $|S_1|/|S_2|$, $|S_2|/|S_3|$, $|S_3|/|S_1|$. Of course, the inverse ratios of the above-mentioned ratios are also possible to obtain the correct results.

In one embodiment, the ratio determination circuit provides two or three signals that are proportional to a logarithm of ratios selected from: $|S_1|/|S_2|$, $|S_2|/|S_3|$, $|S_3|/|S_1|$.

Thus, when more than one ratio determination circuit is provided, the respective logarithms of ratios can be derived simultaneously.

In one embodiment, the ratio determination circuit comprises an exponential circuit determined to provide a signal that is proportional to the exponential function exp(signal$_{input}$) of an input signal signal$_{input}$ thereof. Thus, with equation 1 and $$V_p = V_{RSSI,S1} - V_{RSSI,S2} = c \log(|S_1|/|S_2|), \quad \text{(eqn. 2)}$$

$$V_q = V_{RSSI,S3} - V_{RSSI,S2} = c \log(|S_3|/|S_2|) \quad \text{(eqn. 3)}$$

the cosine rule can be rewritten as:

$$2 \cos \phi = 10^{Vp/c} + 10^{-Vp/c} - 10^{(2Vq - Vp)/c}, \quad \text{(eqn. 4)}$$

where $V_{RSSI,S1}$, $V_{RSSI,S2}$ and $V_{RSSI,S3}$ are the output signals of RSSI-chains fed with the signals $S_1$, $S_2$, and $S_3$ respectively.

In one embodiment, the exponential circuit comprises a bipolar differential stage.

If the values $V_P$ and $V_q$ according to equations 2 and 3 are amplified with a factor $V_T \ln(10)/c$ (where $V_T$ is the thermal voltage $k_B T/q$ (with $k_B$ being the Bolzman's Constant, T the absolute temperature in Kelvin and q the electron charge), signals are obtained that can be fed into the bipolar differential stages.

c can be made proportional to $V_T$. Then, $V_T \ln(10)/c$ becomes a number. If the products $V_p V_T \ln(10)/c$ and $V_q V_T \ln(10)/c$ are fed into the input of the bipolar differential stage then ratios of collector currents $K_p = I_{C1}/I_{C2} = |V_{10}|/|V_{12}|$ and $K_q = I_{C1}/I_{C2} = |V_{20}|/|V_{12}|$ are obtained.

Thus, the ratio of the input levels of the RSSI-chains is transferred linearly to the output collector current ratio. The measure for the phase difference φ can then be expressed in the two dimensionless numbers $K_P$ and $K_q$:

$$2 \cos \alpha = K_P + 1/K_P - K_q^2/K_P. \quad \text{(eqn. 5)}$$

In one embodiment, chopping is utilized to improve the accuracy. In this context, chopping denotes determination of one ratio in one phase using two RSSI-chains and measure the same in the next phase with swapped RSSI-chains. The average value of these measurements is free of offsets of the RSSI-chains.

In one embodiment, the phase detector comprises RF-switches in a selection circuit to select an input signal for the ratio determination circuit.

Three input signals allow to combine three different ratios of the signals when their respective inverse ratios are neglected. However, a reduced number of determination circuits, e.g. only one or two determination circuits, can be sufficient when a selection circuit is utilized to feed a respective input signal into the one or two determination circuits. For that, RF-switches can be utilized.

When three input signals are available, two ratios are independent. A third ratio is a ratio of the first two ratios. Thus, it can be sufficient to work with only two ratios. However, it is possible that the third ratio is measured and utilized to improve the accuracy of the other two ratios.

Thus, in one embodiment, the ratio determination circuit determines three ratios and one ratio is utilized to improve the accuracy of the other two ratios.

In one embodiment, the phase detector comprises one or two switching circuits and a signal memory. When a signal memory is used to store information, e.g. voltage or current information, the same calculation circuit or ratio determination circuit can be utilized to process data from the different sources one after the other. Thus, the number of RSSI-chains, ratio determination circuits or calculation circuits can be reduced.

In one embodiment, the phase detector provides information about positive ratios selected from: $|S_1|/|S_2|$, $|S_2|/|S_3|$, $|S_3|/|S_1|$, provides information about the phase difference α, and is an impedance detector. Thus, by not only providing phase information but also providing information about the ratios of voltages themselves, a fully functional impedance detector is obtained.

In one embodiment, the calculation circuit utilizes a lookup table. The lookup table can comprise sampled versions for cos α in one column and the respective value for α in a second column. Then, α can directly be provided instead of cos α as the measure for α.

Examples of the phase detector, its basic principles and ideas are shown in the schematic figures.

SHORT DESCRIPTION OF THE FIGURES

DETAILED DESCRIPTION

Figure 1:
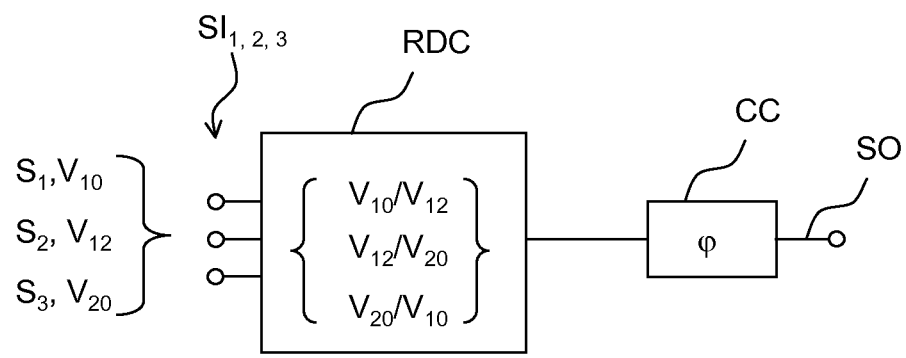
FIG. 1 shows that phase information is obtained by processing ratio information.

FIG. 1 shows the basic principle of the phase detector PD: three input signals $S_1$, $S_2$, $S_3$ can be utilized to derive phase information. The three input signals $S_1$, $S_2$, $S_3$ could be voltages. Phase information could be the phase difference $\alpha$ between $S_2$ and $S_1$. On that account, the phase detector PD comprises a ratio determining circuit RDC having a first, a second, and a third signal input $SI_1$, $SI_2$, $SI_3$. For the three signals $S_1$, $S_2$, and $S_3$, the three ratios: $|S_1|/|S_2|$, $|S_2|/|S_3|$, and $|S_3|/|S_1|$ (and the respective inverse values) can be combined. It is the central idea of the present invention to utilize the—relatively easily obtainable—ratios to obtain phase information. In principle, only two of the three ratios are necessary to obtain phase information because one of the three ratios is the ratio between the respective other two ratios. The ratio determination circuit determines the respective ratios and provides them to a calculation circuit CC. The calculation circuit CC derives the phase information from the ratios. The phase information can be a value that is proportional to the cosine of the phase difference $\alpha$. However, it is possible that the calculation circuit directly provides the phase difference $\alpha$ at a signal output SO.

Thus, only ratios need to be determined and phase information is obtained. No direct measurement of a phase information such as the phase difference between two input signals is necessary.

Figure 2:
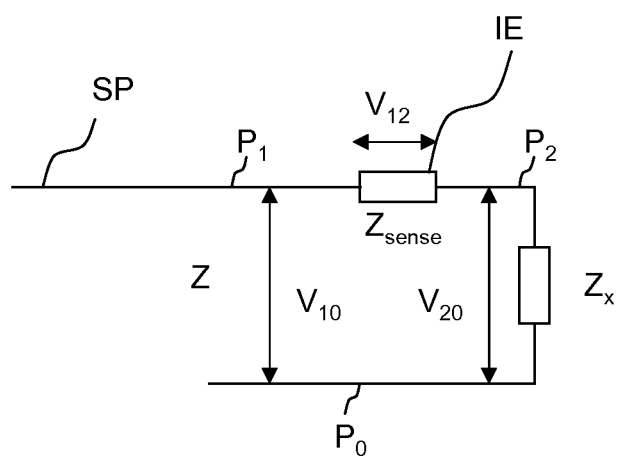
FIG. 2 shows an equivalent circuit diagram of a signal path comprising an unknown load impedance $Z_x$ and a sensing impedance $Z_{sense}$.

FIG. 2 schematically shows a signal path SP in which radio frequency signals may travel. A potentially variable load impedance is denoted as $Z_x$. Further, the signal path SP comprises a sensing element $Z_{sense}$ needed for determining phase information. The sensing impedance $Z_{sense}$ could be established by an inductive element IE. $S_1$, $S_3$, and $S_2$ could be the voltage, i.e. the potential differences, between the potentials $P_0$, $P_1$, and $P_2$. Also, other types of sensing elements can be used.

In the circuit shown in FIG. 2, when the signals $S_1$, $S_2$, and $S_3$ are voltages, then $S_1=S_2+S_3$.

Figure 3A:
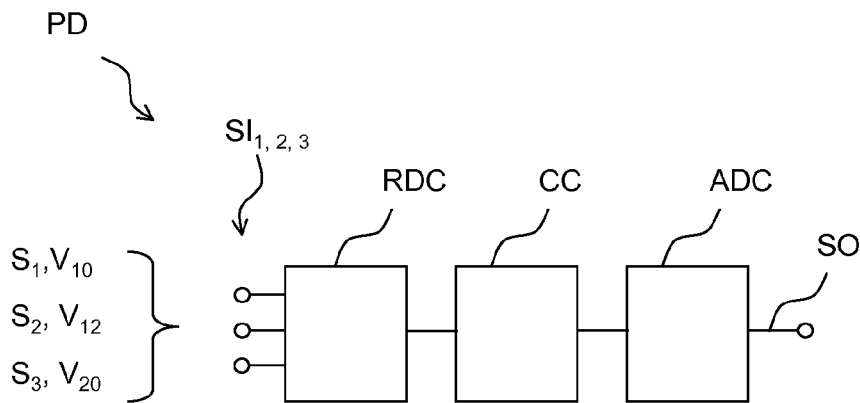
FIG. 3A shows an embodiment of the phase detector comprising a ratio determination circuit RDC, a calculation circuit CC, and an analog/digital converter ADC.

FIG. 3A shows an embodiment of the phase detector PD comprising a ratio determination circuit RDC, a calculation circuit CC and an analog/digital converter ADC. The calculation circuit CC obtains ratio information from the ratio determination circuit RDC and provides analog phase information to the analog/digital converter ADC. The analog/digital converter ADC provides a digital output of the phase information at the signal output SO.

Figure 3B:
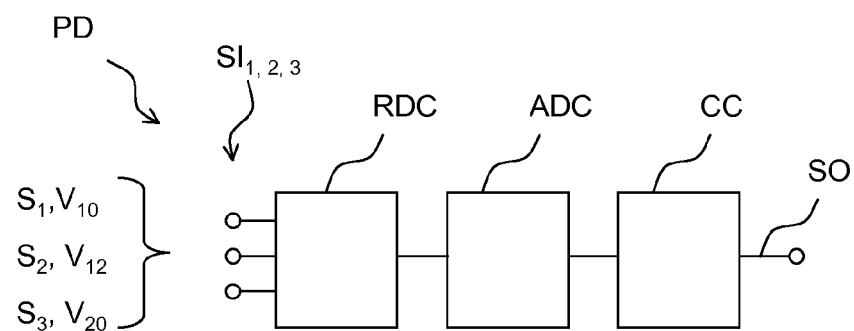
FIG. 3B shows an embodiment of a phase detector where an analog/digital converter ADC is connected between a ratio determination circuit RDC and a calculation circuit CC.

FIG. 3B shows an alternative embodiment of the phase detector compared to FIG. 3A where the analog/digital converter ADC is connected between the ratio determination circuit RDC and the calculation circuit CC. In this embodiment, the calculation circuit CC works in the digital domain while in the embodiment according to FIG. 3A, the calculation circuit CC works in the analog domain.

Figure 3C:
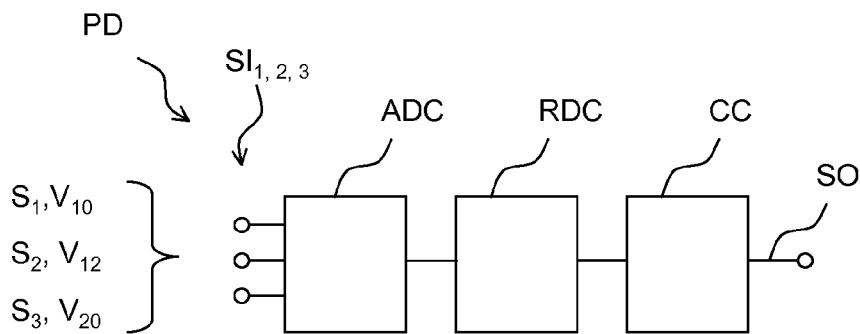
FIG. 3C shows an embodiment of a phase detector PD where an analog/digital converter ADC is connected before a ratio determination circuit RDC.

FIG. 3C shows an embodiment of the phase detector PD where the ratio determination circuit RDC is connected between the analog/digital converter ADC and the calculation circuit CC. The analog/digital converter ADC is directly connected to the signal inputs $SI_1$, $SI_2$, $SI_3$. In this embodiment, the ratio determination circuit and the calculation circuit CC work in the digital domain.

Figure 4:
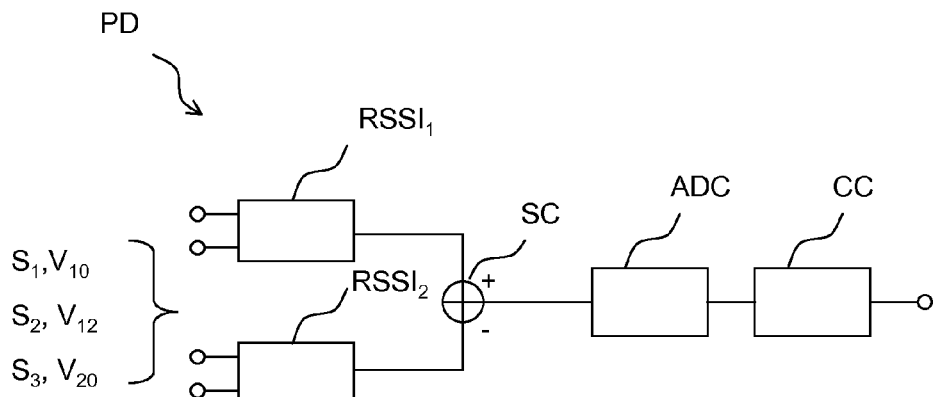
FIG. 4 shows an embodiment of a phase detector comprising two RSSI-chains, an analog/digital converter ADC, and a calculation circuit CC.

FIG. 4 shows an embodiment of the phase detector PD comprising a first RSSI-chain $RSSI_1$ and a second RSSI-chain $RSSI_2$. Each RSSI-chain can provide a signal that is mainly proportional to a logarithm of an input signal. Two of the three input signals $S_1$, $S_2$, and $S_3$ are fed into the RSSI-chains. Due to the addition theorem of the exponential function, the difference between the logarithmic values of the input signals corresponds to the logarithmic value of the respective ratio of the original input signals. Thus, the logarithmic value of the ratio is provided to the analog/digital converter ADC.

For obtaining phase information, two ratios are necessary. However, different ratios can be provided by the two RSSI-chains one after the other. Then, the calculation circuit CC can determine the phase information based on the signals derived from the RSSI-chains.

Figure 5:
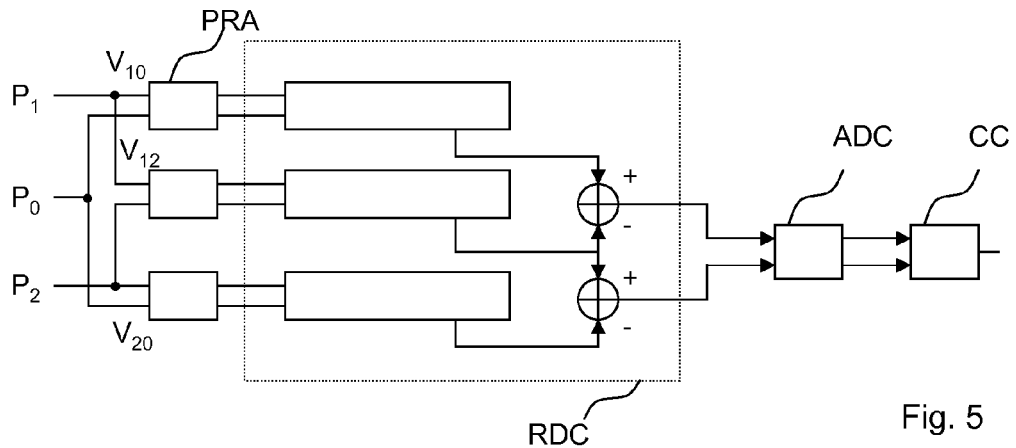
FIG. 5 shows an embodiment of the phase detector where the ratio determination circuit RDC comprises three RSSI-chains which are fed by pre-amplifiers.

FIG. 5 shows an embodiment of a phase detector where the ratio determination circuit RDC comprises three RSSI-chains. The ratio determination circuit RDC further comprises two subtraction circuits. Each subtraction circuit is connected to two RSSI-chains. Thus, two ratio information signals (to be more precise: two signals being proportional to the logarithmic values of the respective ratios) can be provided to the analog/digital converter ADC.

The phase detector shown in FIG. 5 further comprises pre-amplifiers PRA between the signal inputs and the RSSI-chains. The pre-amplifiers PRA can be utilized to scale the level of the input signals to a level that is compatible with the dynamic RSSI-range of the RSSI-chains.

Figure 6:
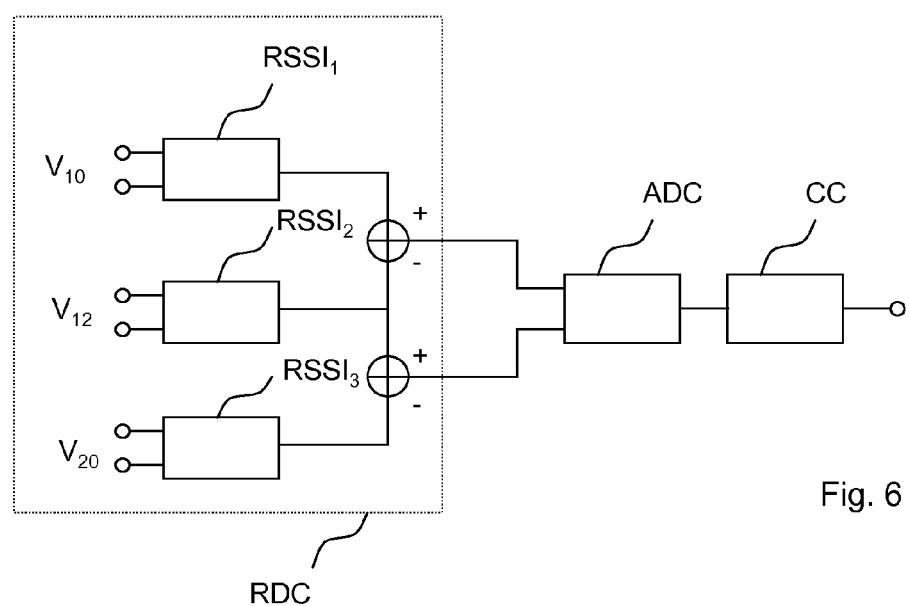
FIG. 6 shows the association of signals and their respective signal inputs of RSSI-chains of an embodiment of a phase detector.

FIG. 6 shows the correlation between the three RSSI-chains and the respective input signal: the first input signal $S_1$ can be fed into the first RSSI-chain $RSSI_1$. The second input signal $S_2$ can be fed into the second RSSI-chain $RSSI_2$. The third input signal $S_3$ can be fed into the third RSSI-chain $RSSI_3$.

Then, two ratios can be delivered simultaneously to the following circuitry. In addition to the embodiments shown in FIGS. 5 and 6, it is possible to provide a respective third subtraction circuit connected to the first RSSI-chain $RSSI_1$ and the third RSSI-chain $RSSI_3$ to provide the third ratio which can be utilized to increase the accuracy of the phase detector.

However, chopping methods where an average value between a ratio obtained from two RSSI-chains and the inverse ratio obtained from exchanged RSSI-chains are utilized can be used to increase the accuracy, too. Then, especially offsets or distortions by non optimal proportional factors of the RSSI-chains are easily reduced or eliminated.

Figure 7:
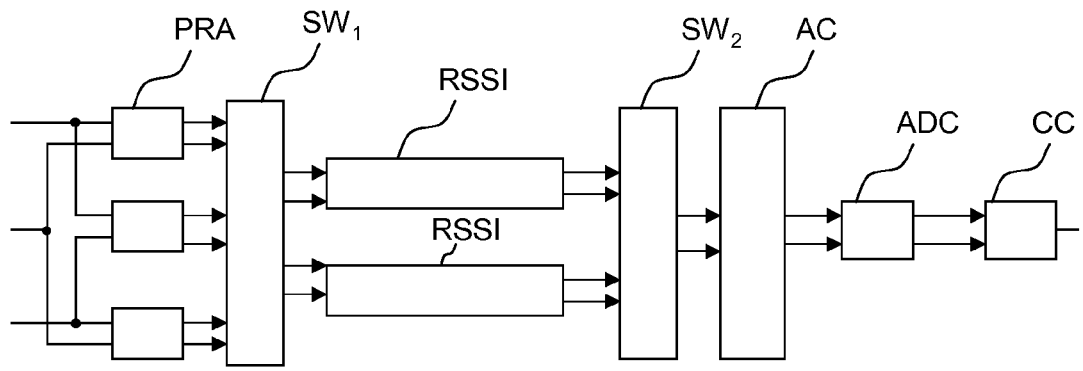
FIG. 7 shows an embodiment of a phase detector comprising a switching circuit $SW_1$ between pre-amplifiers and RSSI-chains and another switching circuit $SW_2$ between the RSSI-chains and an additional analog circuit AC.

FIG. 7 shows an embodiment of a phase detector comprising a first switching circuit $SW_1$ and a second switching circuit $SW_2$. The first switching circuit is connected between pre-amplifiers PRA and the RSSI-chains. The second switching circuit $SW_2$ is connected between the RSSI-chains and subsequent circuitry, such as an additional circuitry AC, an analog/digital circuit ADC and a calculation circuit CC.

Although in principle two ratios have to be measured and therefore three RSSI-chains are needed, two RSSI-chains—with or without chopping—or a single RSSI-chain without chopping can be utilized in combination with a switching circuit. Then, the switching circuit electrically connects the respective signal input to the one or two RSSI-chains.

The additional circuitry AC can comprise the subtraction circuits or circuits providing an exponential transfer function and thus restoring the original signal level on which logarithmic functions by the RSSI-chains were performed.

Figure 8:
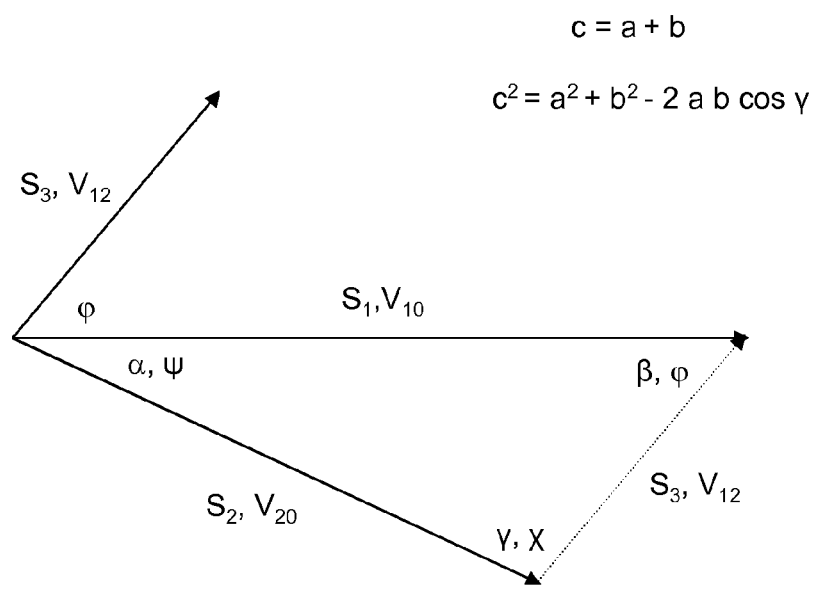
FIG. 8 shows fundamental correlations between the different input signals.

FIG. 8 shows the correlations between the input signals $S_2$, $S_1$, $S_3$. $S_2$ could be the voltage drop $V_{12}$ across the sensing element $Z_{sense}$, which may be an inductive element. $S_1$ may be the voltage $V_{10}$ between the input of the signal path and a ground potential. $S_3$ is the voltage drop $V_{12}$ across the unknown load impedance $Z_x$. Then, $V_{10}$ is the sum of voltages $V_{20}$ and $V_{12}$. Accordingly, the three voltages establish a triangle defined by the length of the vectors and the respective angles. Assuming that the rules of Euclidian geometry is valid, the cosine of each angle is determined by the ratios of the respective side lengths of the triangle.

As a result of the inventors' findings, an alternative phase detector is provided that makes direct phase measurement dispensible.

The phase detector is not limited to the embodiments described in the specification or shown in the figures. Phase detectors comprising further elements such as further RSSI-chains, calculation circuits, analog/digital converters or amplifiers or combinations thereof are also comprised by the present invention. The features shown above do not exclude each other. The phase detector can comprise each feature in combination with other features.

LIST OF REFERENCE SYMBOLS $\alpha$, $\beta$, $\gamma$: phase differences between input signals $S_1$, $S_2$, $S_3$
a: length of triangle side representing S2
ADC: analog/digital converter
b: length of triangle side representing S3
c: length of triangle side representing S1
CC: calculation circuit
IE: inductive element
$P_0$, $P_1$, $P_2$: first, second, third potential
PD: phase detector
PRA: pre-amplifier
RDC: ratio determination circuit
$RSSI_1$: first RSSI-chain
$RSSI_2$: second RSSI-chain
$RSSI_3$: third RSSI-chain
SC: Subtraction circuit
$SI_1$, $SI_2$, $SI_3$: first, second, third signal input
SO: signal output
SP: signal path
$SW_1$, $SW_2$: first, second switching circuit
$\phi$, $\chi$, $\psi$: phase differences between voltages $V_{10}$, $V_{12}$, $V_{20}$
$S_1$, $S_2$, $S_3$: first, second, third input signal
Z: total impedance $Z_{sense}+Z_x$
$Z_{sens}$: sensing impedance
$Z_x$: load impedance

The invention claimed is:

1. A phase detector, comprising;
a first signal input determined to receive a first signal $S_1$;
a second signal input determined to receive a second signal $S_2$ having a phase difference $\alpha$ relative to the first signal S1;
a third signal input determined to receive a third signal $S_3$;
a ratio-determination circuit for determining 2 ratios selected from: $|S_1|/|S_2|$, $|S_2|/|S_3|$, $|S_3|/|S_1|$;
a calculation circuit determined to derive a measure of a phase difference between the input signals by evaluating the two ratios obtained from the ratio-determining circuit; and
a signal output determined to provide the measure of the phase difference.

2. The phase detector of claim 1, wherein the first signal $S_1$, the second signal $S_2$ and third signal $S_3$ are voltage or current signals.

3. The phase detector of claim 1, wherein one of the signals $S_1$, $S_2$, $S_3$ is the sum of the respective other two signals.

4. The phase detector of claim 1, wherein:
the first signal $S_1$ is a voltage $V_{10}$ across a serial connection of a sensing impedance $Z_{sense}$ and a further impedance $Z_x$;
the second signal $S_2$ is a voltage $V_{20}$ across the sensing impedance $Z_{sense}$; and
the third signal $S_3$ is a voltage $V_{12}$ across to the further impedance $Z_x$.

5. The phase detector of claim 1, wherein cos $\alpha$ is the measure for the phase difference $\alpha$.

6. The phase detector of claim 1, wherein:
the ratio-determination circuit works in one of the analog domain and the digital domain; and
the phase detector comprises an analog/digital-converter.

7. The phase detector of claim 1, wherein:
the calculation circuit works in one of the analog domain and the digital domain; and
the phase detector comprises an analog/digital-converter.

8. The phase detector of claim 1, wherein the ratio-determination circuit comprises one, two, or three RSSI-chains determined to provide a signal that is proportional to a logarithm of a signal selected from: the first signal $S_1$, the second signal $S_2$, and the third signal $S_3$.

9. The phase detector of claim 1, wherein the ratio-determination circuit comprises one or two or three subtraction circuits.

10. The phase detector of claim 1, wherein the ratio-determination circuit provides a signal that is proportional to a logarithm of a ratio selected from: $|S_1|/|S_2|$, $|S_2|/|S_3|$, $|S_3|/|S_1|$.

11. The phase detector of claim 1, wherein the ratio-determination circuit provides two or three signals that are proportional to a logarithm of ratios selected from: $|S_1|/|S_2|$, $|S_2|/|S_3|$, $|S_3|/|S_1|$.

12. The phase detector of claim 1, wherein the ratio-determination circuit comprises an exp-circuit determined to provide a signal that is proportional to the exponential function of an input signal thereof.

13. The phase detector of claim 12, wherein the exp-circuit comprises a bipolar differential stage.

14. The phase detector of claim 1, wherein the ratio-determination circuit comprises one, two, or three preamplifiers determined to amplify at least one of the signals ($S_1$, $S_2$, $S_3$).

15. The phase detector of claim 1, wherein the ratio-determination circuit is determined to provide 2 positive signals selected from: $|S_1|/|S_2|$, $|S_2|/|S_3|$, $|S_3|/|S_1|$.

16. The phase detector of claim 1, wherein chopping is utilized to improve the accuracy.

17. The phase detector of claim 1, further comprising RF-switches in a selection circuit to select an input signal for the ratio-determination circuit.

18. The phase detector of claim 1, wherein:
the ratio-determination circuit determines 3 ratios: $|S_1|/|S_2|$, $|S_2|/|S_3|$, and $|S_3|/|S_1|$; and
one ratio is utilized to improve the accuracy of the other two ratios.

19. The phase detector of claim 1, further comprising one or two switching circuits and a signal memory.

20. The phase detector of claim 1, wherein the phase detector:
provides information about a positive ratio selected from: $|S_1|/|S_2|$, $|S_2|/|S_3|$, $|S_3|/|S_1|$;
provides information about the phase difference $\alpha$; and
is an impedance detector.

21. The phase detector of claim 1, wherein the calculation circuit utilizes a lookup table.

* * * * *